United States Patent
Shibuya et al.

(12)

(10) Patent No.: US 6,338,868 B1
(45) Date of Patent: Jan. 15, 2002

(54) METHOD FOR THE FORMATION OF A SILICEOUS COATING FILM

(75) Inventors: Tatsuhiko Shibuya, Yokohama; Yoshio Hagiwara, Tokyo-to, both of (JP)

(73) Assignee: Tokyo Ohka Kogyo Co., Ltd., Kanagawa-ken (JP)

(*) Notice: Subject to any disclaimer, the term of this patent is extended or adjusted under 35 U.S.C. 154(b) by 0 days.

(21) Appl. No.: 09/733,948

(22) Filed: Dec. 12, 2000

Related U.S. Application Data

(62) Division of application No. 09/327,558, filed on Jun. 8, 1999, now Pat. No. 6,190,788.

(30) Foreign Application Priority Data

Jun. 24, 1998 (JP) .......................................... 10-177523

(51) Int. Cl.[7] .................................................. B05D 3/02
(52) U.S. Cl. ........................ 427/10; 427/379; 427/387
(58) Field of Search ............................ 427/10, 379, 387

(56) References Cited

U.S. PATENT DOCUMENTS

| | | |
|---|---|---|
| 5,614,251 A | 3/1997 | Sakamoto et al. |
| 5,614,271 A | 3/1997 | Shibuya et al. |
| 5,885,654 A | 3/1999 | Hagiwara et al. |

FOREIGN PATENT DOCUMENTS

| | | |
|---|---|---|
| EP | 0 611 067 | 8/1994 |
| EP | 0 781 815 | 7/1997 |
| EP | 1002824 A1 * | 5/2000 |
| JP | 4-63833 | 2/1992 |
| JP | 5-121572 | 5/1993 |
| JP | 6-73340 | 3/1994 |
| JP | 6-128529 | 5/1994 |

* cited by examiner

*Primary Examiner*—Erma Cameron
(74) *Attorney, Agent, or Firm*—Wenderoth, Lind & Ponack, LLP

(57) ABSTRACT

Disclosed is a method for the formation of a silica coating film having a remarkably high crack-forming thickness limit on the surface of a substrate which may be highly heat resistant, for example, having a circuit wiring layer of polycrystalline silicon to withstand a temperature higher than 500° C. without excessive diffusion of dopant through the source layer or drain layer of the semiconductor device. The method comprises the steps of: coating the substrate surface with a coating solution containing a modified polysilazane which is a reaction product of a polysilazane and a dialkyl alkanol amine, drying the coating layer, subjecting the coating layer to a first baking treatment at 350–450° C. for 10–60 minutes and subjecting the layer to a second baking treatment at 550–800° C. for 0.5–60 minutes.

12 Claims, 2 Drawing Sheets

US 6,338,868 B1

METHOD FOR THE FORMATION OF A SILICEOUS COATING FILM

This a divisional of Ser. No. 09/327,558, filed Jun. 8, 1999 now U.S. Pat. No. 6,190,788.

BACKGROUND OF THE INVENTION

The present invention relates to a method for the formation of a siliceous coating film on the surface of a substrate. More particularly, the invention relates to a method for the formation of a siliceous coating film having high resistance against formation of cracks to serve as a planarizing layer or an insulating layer on the surface of a substrate such as a substrate material for the preparation of semiconductor devices, liquid crystal display panels and the like which can withstand a relatively high temperature of heat treatments.

By virtue of the excellent properties in respect of heat resistance, abrasion resistance, corrosion resistance and others, silica-based coating films are widely formed and employed in the manufacturing processes of electronic industries, for example, as a planarizing covering layer on a semiconductor substrate provided with a circuit wiring layer of a metal or other conductive materials forming level differences on the substrate surface, and as an electric insulating layer, in semiconductor devices, between the substrate surface and a metallic circuit wiring layer thereon and between two metallic circuit wiring layers or, in liquid crystal display panels, between the base glass plate and a transparent electrode layer of ITO (indium-tin oxide) or between the ITO layer and the oppositely facing electrode layer.

Several methods are known in the art and practiced in recent years for the formation of a silica-based coating film as mentioned above including a method in which a substrate surface is coated with a coating solution containing a polysilazane compound as a film-forming constituent followed by drying and a heat treatment to convert the polysilazane film into a silica-based film and a method in which the coating solution contains a polysilazane compound modified by a reaction with an alkyl amine or alkanol amine compound (see, for example, Japanese Patent Kokai 5-121572, 6-73340, 6-128529, 7-2511 and 9-157544).

Each of the above described methods is taught to be applicable to the surface of a substrate having a circuit wiring layer of a metal such as aluminum having relatively low heat resistance not to give a high reliability limiting temperature. In fact, the heat treatment for the formation of the silica-based coating film is conducted at a relatively low temperature of about 450 to 500° C. in consideration of the low heat resistance of the aluminum layer.

The above mentioned polysilazane-containing coating solution, which is used usually in a process involving a baking treatment at 450 to 500° C., is not suitable for the formation of a coating film of silica even by increasing the baking temperature to 550 to 800° C. due to the problem that the rate of oxidative conversion of the polysilazane layer into a silica film cannot be high enough sometimes resulting in an incompletely oxidized silica-based film leaving Si—H linkages and N—H linkages originating in the starting polysilazane compound not to exhibit high etching resistance.

It is also a known method disclosed in Japanese Patent Kokai 4-63833 that a coating solution, which contains a polysilazane compound modified or inactivated beforehand by the reaction with hexamethyl disilazane and the like to destroy the active hydrogen atoms bonded to the silicon atoms or nitrogen atoms in the polysilazane compound, is used for the formation of a coating layer. This method, however, is not without a problem, in particular, when applied to a surface having stepped level differences because, although the silica coating film formed from an inactivated polysilazane compound has high hardness and exhibits good etching resistance on the raised areas of the stepped substrate surface, the coating film formed on the recessed areas of the stepped substrate surface sometimes exhibits only poor etching resistance adversely affecting the performance of the semiconductor devices.

When the substrate, on which an insulating or planarizing layer of silica is to be formed, has high heat resistance to withstand a temperature of 800 to 1000° C. as is the case when the circuit wiring layer is formed from a more heat-resistant material such as polycrystalline silicon, it is an established prior art that a coating layer of phosphosilicate glass (PSG) is first formed on the substrate surface by the chemical vapor-phase deposition (CVD) method followed by a reflow heat treatment undertaken at about 1000° C. In addition to a disadvantage due to low productivity and high costs, a problem in this method is that, as a consequence of this high temperature for the reflow heat treatment, the performance of the semiconductor devices prepared by this method is adversely affected due to excessive diffusion of the dopant through the source layer and drain layer of the device.

As a method for the formation of a silica-based insulating or planarizing layer on a substrate surface without necessitating a heat treatment at such a high temperature mentioned above, the so-called SOG (spin-on-glass) method is proposed by using a coating solution. This method, however, cannot substitute the CVD method mentioned above because the silica-based coating film formed by this SOG method using a conventional coating solution cannot be thick enough without a trouble of crack formation, namely, with a low crack-forming thickness limit.

SUMMARY OF THE INVENTION

The present invention accordingly has an object to provide, in view of the above described problems and disadvantages in the prior art methods, a novel and improved method for the formation of a siliceous coating film having a high crack-forming thickness limit by using a coating solution without necessitating a high-temperature heat treatment as is essential in the CVD method applicable to a substrate of high-temperature resistance to be freed from the trouble due to excessive diffusion of the dopant in the source layer and drain layer.

Thus, the method of the invention for the formation of a siliceous coating film on the surface of a substrate comprises the steps of:

(a) coating the surface of the substrate with a coating solution containing a reaction product of a polysilazane compound and a dialkyl alkanol amine, referred to as the modified polysilazane hereinafter, to form a coating layer;

(b) drying the coating layer to form a dried coating layer;

(c) subjecting the dried coating layer of the modified polysilazane to a first heat treatment at a temperature in the range from 350 to 450° C. for a length of time in the range from 10 to 60 minutes; and (d) subjecting the coating layer after the first heat treatment to a second heat treatment at a temperature in the range from 550 to 800° C. for a length of time in the range from 0.5 to 60 minutes.

In particular, the first heat treatment in step (c) is conducted under monitoring of the infrared absorption spectrum of the coating layer until substantially complete disappearance of the absorption bands at wave numbers in the vicinities of 800 to 880 cm$^{-1}$, 950 cm$^{-1}$ and 2200 cm$^{-1}$.

DETAILED DESCRIPTION OF THE PREFERRED EMBODIMENTS

Figure 1:
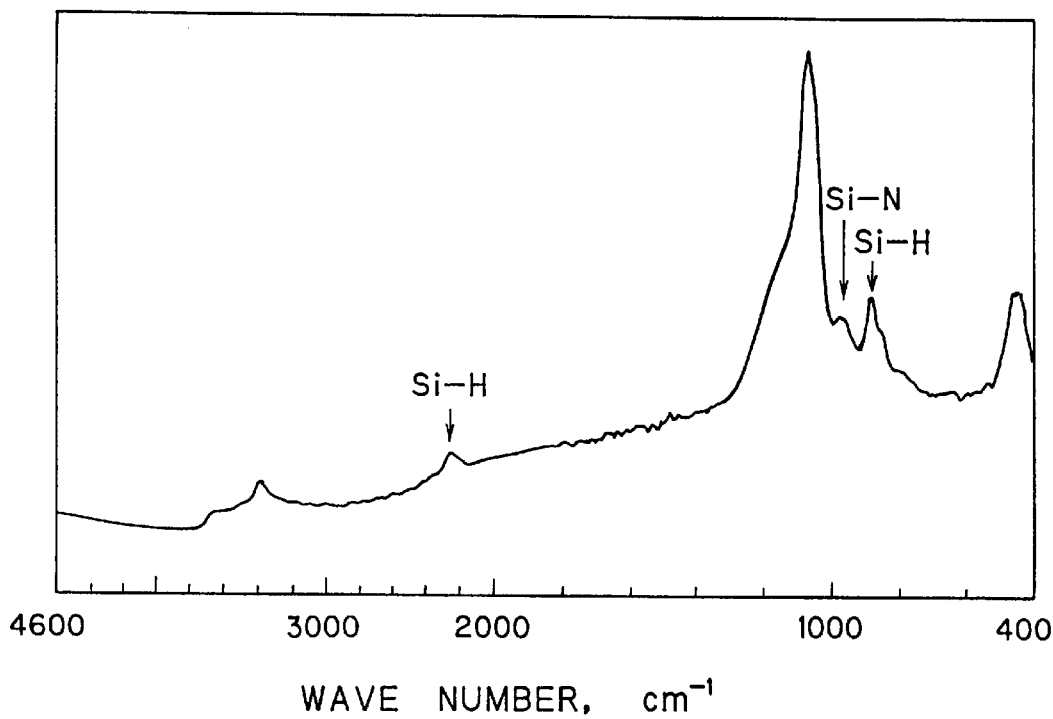
FIG. 1 is an infrared absorption spectrum of a coating film of the modified polysilazane compound prepared in Preparation 1.

As is understood from the above given summarizing description, the characteristic features of the inventive method consist in the use of a very specific and unique coating solution and in the specific and unique conditions of heat treatment of the coating layer which is conducted in two steps.

Namely, the film-forming ingredient in the coating solution is a modified polysilazane compound which is a reaction product of a polysilazane compound and a dialkyl alkanol amine. In the formation of a silica coating film by a coating method with a polysilazane compound, it is a known method that the polysilazane compound is treated beforehand with hexamethyl disilazane and the like to inactivate the hydrogen atoms directly bonded to the silicon atoms and nitrogen atoms. A problem in this case is that the silica coating film thus formed sometimes has low etching resistance in the recessed areas of the substrate surface having stepwise level differences. In this regard, it is an object of the present invention to provide a novel process capable of dissolving the above mentioned disadvantage in the prior art method by using an inactivated polysilazane compound. The starting polysilazane compound, which is not particularly limitative and is used without any inactivation treatment, can be prepared, for example, from dichlorosilane and ammonia as the starting materials. As is known, this polysilazane compound has active hydrogen atoms or, namely, hydrogen atoms bonded to the silicon atoms and nitrogen atoms to be susceptible to a crosslinking reaction with an increase of the viscosity or gelation.

This trouble of viscosity increase or gelation is increased as the molecular weight of the polysilazane compound is increased and a high molecular weight polysilazane is undesirable also in view of obtaining an appropriate concentration of the modified polysilazane for the formation of a coating layer of a sufficiently large thickness by a single coating work and convenience of concentration adjustment. When the molecular weight of the polysilazane compound is too low, on the other hand, a decrease is caused in the crosslinkability of the polymer molecules resulting in appearance of an orange-peel defect on the surface of the coating layer and an increase is caused in the sublimation of the modified polysilazane in the course of the drying treatment resulting in a decrease in the thickness of the coating layer or formation of cracks therein. Accordingly, the starting polysilazane compound should have a weight-average molecular weight Mw in the range from 1500 to 5000 or, preferably, from 1700 to 3000 as determined by the gel permeation chromatographic (GPC) method by making reference to known polystyrene samples. The dispersion of the molecular weight as indicated by the ratio of Mw:Mn (Mn: number-average molecular weight) is also an important characterizing parameter of a polymeric compound and the polysilazane compound should have a Mw:Mn not exceeding 4.

The modified polysilazane as the film-forming ingredient in the coating solution used in the inventive method is prepared by reacting the above described polysilazane compound with a dialkyl alkanol amine compound exemplified by N,N-dimethyl ethanolamine, N,N-diethyl ethanolamine, N,N-dibutyl ethanolamine, N,N-dimethyl propanolamine, N,N-dimethyl butanolamine, N,N-dimethyl pentanolamine, N,N-dimethyl hexanolamine and N,N-dimethyl heptanolamine, of which dimethyl alkanol amines are preferable and N,N-dimethyl hexanolamine is more preferable, although any of these dialkyl alkanol amines can be used either singly or as a combination of two kinds or more according to need. Several grades of modified polysilazane products are available on the market and can be used as such in the present invention.

The reaction of a polysilazane compound with the above described dialkyl alkanol amine compound is conducted in an organic solvent to give a solution containing the modified polysilazane compound, for example, according to the procedure disclosed in Japanese Patent Kokai 6-128529. Namely, a starting polysilazane compound and a dialkyl alkanol amine compound are jointly dissolved in an organic solution in a molar ratio in the range from 99.9:0.1 to 50:50 to give a solution which is kept standing at a temperature in the range from 0° C. to the boiling point of the solvent so that the reaction proceeds between the reactants to give a modified polysilazane compound. If necessary, the concentration of the thus prepared solution is adjusted to have a concentration and viscosity suitable for the coating works therewith.

The organic solvent used in the preparation of the modified polysilazane solution is not particularly limitative provided that the reactants can be dissolved therein. Examples of suitable organic solvents include alcohols such as methyl and ethyl alcohols, ketones such as methyl isobutyl ketone, glycol ethers such as ethyleneglycol monomethyl ether, hydrocarbon compounds such as cyclohexane, toluene, xylene, mesitylene, cyclohexene, dimethyl cyclohexane, ethyl cyclohexane, p-menthane, Decalin, i.e. decahydronaphthalene, 2,2,5-trimethylhexane, dipentene, decane, isononane and octane, and ethers such as ethyl butyl ether, dibutyl ether, dioxane and tetrahydrofuran. These organic solvents can be used either singly or as a mixture of two kinds or more.

Though not particularly limitative, the concentration of the modified polysilazane compound in the coating solution used in the inventive method is in the range from 10 to 40% by weight or, preferably, from 15 to 25% by weight. When the concentration is too high, a decrease is caused in the storage stability of the coating solution along with a disadvantage of difficulty in the control of the thickness of the silica coating film formed by using the coating solution. When the concentration is too low, on the other hand, only a very limited thickness can be obtained of the coating film formed by a single coating work necessitating several times repetition of recoating until a silica coating film having a desired thickness could be obtained.

The method of the present invention is applicable to any substrate materials provided that the substrate material can withstand the temperature of the heat treatment in the inventive method. Since the heat treatment in step (d) of the inventive method is performed at a temperature of 550 to 800° C. for 0.5 to 60 minutes or, preferably, for 0.5 to 15 minutes, namely, the substrate material must withstand a heat treatment at 550° C. for 0.5 minute at the least. A semiconductor silicon wafer as such can of course be the substrate material for the application of the inventive method but, when the silicon wafer is provided with a circuit wiring layer, the material of the wiring layer cannot be a metallic element such as aluminum because the performance of a circuit wiring layer of aluminum is adversely affected by a treatment at a temperature exceeding 500° C. so that the temperature in the heat treatment for the formation of a silica-based coating film is limited to about 450 to 500° C. at the highest in order not to adversely affect the performance of the semiconductor device. In this regard, the method of the present invention is quite satisfactorily applicable to a substrate material having a heat-resistant circuit wiring layer which is formed usually from polycrystalline silicon on a silicon wafer.

In step (a) of the inventive method, a heat-resistant substrate material mentioned above is coated with the coating solution containing the modified polysilazane compound at room temperature or in the range from 20 to 25° C. by a known coating method such as spinner method, spray coating method and dip coating method to form a coating layer of the coating solution followed by a heat treatment in step (b) at 100 to 300° C. to evaporate the solvent in the coating layer giving a dried coating layer of the modified polysilazane compound.

In the next place, the thus dried coating film of the modified polysilazane compound is subjected in step (c) to a first baking treatment at a temperature in the range from about 350 to 450° C. for 10 to 60 minutes. This first baking treatment is performed in an atmosphere of an inert gas such as nitrogen or an oxidizing gas such as water vapor, of which an atmosphere of water vapor is preferable though dependent on the types of the substrate materials.

The length of time for this first baking treatment is selected by conducting the treatment under monitoring of the infrared absorption spectrum of the coating film until substantial disappearance of the absorption bands at wave number ranges in the vicinities of 800–880 $cm^{-1}$, 950 $cm^{-1}$ and 2200 $cm^{-1}$ assignable to the Si—H bond, Si—N bond and Si—H bond, respectively. When this first baking treatment is omitted and the dried coating film is directly subjected to the baking treatment at 550–800° C., the Si—H and N—H bonds in the modified polysilazane compound cannot be fully decomposed to leave a substantial amount thereof in the coating film not to give desirable properties to the silica coating film.

The coating film after the above described first baking treatment is then subjected in step (d) of the inventive method to a second baking treatment at a temperature in the range from 550 to 800° C. for 0.5 to 60 minutes or, preferably, for 0.5 to 15 minutes although the length of time for this second baking treatment should be as short as possible, for example, in the range from 0.5 to 3 minutes in order not to adversely affect the performance of the semiconductor devices. This second baking treatment has an effect to densify the silica coating film so that the crack-forming limit thickness of the coating film can be increased to reach 1.2 μm or even larger along with increased etching resistance of the coating film.

In the following, the method of the present invention is described in more detail by way of examples, as preceded by a description of the preparation procedure of the coating solution, which, however, never limit the scope of the invention in any way.

Preparation 1

A dibutyl ether solution containing 19% by weight of a modified polysilazane compound, referred to as the first coating solution hereinafter, for the formation of a silica coating film was prepared by the reaction of N,N-dimethyl hexanolamine with a polysilazane compound having a weight-average molecular weight of 2400 and a molecular weight dispersion Mw:Mn of 2.34 as synthesized by a conventional method from dichlorosilane and ammonia as the starting materials.

FIG. 1 of the accompanying drawing is an infrared absorption spectrum of a film prepared by drying the above prepared coating solution on a hot plate showing absence of absorption bands in the vicinities of wave numbers 3000 $cm^{-1}$ and 1200 $cm^{-1}$ assignable to —CH and Si—$CH_3$, respectively.

Preparation 2

A dibutyl ether solution containing 19% by weight of a polysilazane compound, referred to as the second coating solution hereinafter, for the formation of a silica coating film was prepared by dissolving a polysilazane compound having a weight-average molecular weight of 2400 and a molecular weight dispersion Mw:Mn of 2.34 as synthesized by a conventional method from dichlorosilane and ammonia as the starting materials.

Preparation 3

A dibutyl ether solution containing 19% by weight of an inactivated polysilazane compound, referred to as the third coating solution hereinafter, for the formation of a silica coating film was prepared by admixing 1.0% by weight, based on the inactivated polysilazane compound, of tri-n-pentylamine to a solution obtained by the reaction of hexamethyl disilazane with a polysilazane compound having a weight-average molecular weight of 2400 and a molecular weight dispersion Mw:Mn of 2.34 as synthesized by a conventional method from dichlorosilane and ammonia as the starting materials.

Figure 2:
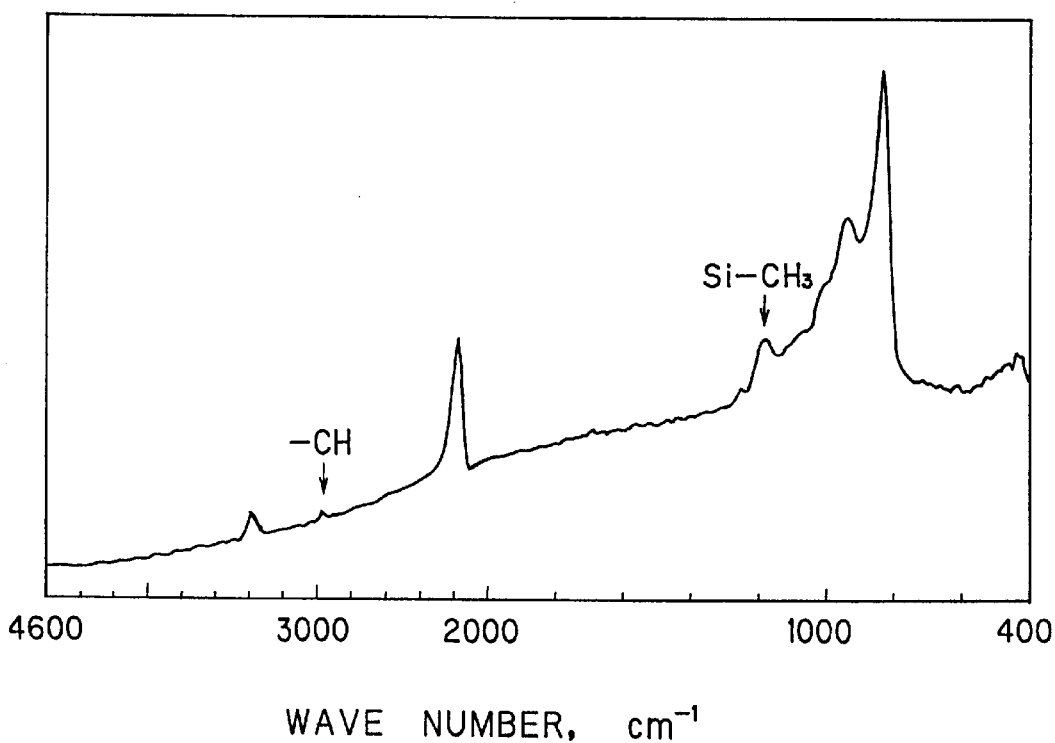
FIG. 2 is an infrared absorption spectrum of a coating film of a polysilazane compound after an inactivation treatment with hexamethyl disilazane.

FIG. 2 of the accompanying drawing is an infrared absorption spectrum of a film prepared by drying the above prepared coating solution on a hot plate showing occurrence of absorption bands in the vicinities of wave numbers 3000 $cm^{-1}$ and 1200 $cm^{-1}$ assignable to —CH and Si—CHs, respectively.

Preparation 4

A coating solution, referred to as the fourth coating solution hereinafter, for the formation of a silica coating film was prepared in the following manner. Thus, 80.75 g (0.53 mole) of tetramethoxy silane were dissolved under agitation in 298 g (6.48 moles) of ethyl alcohol to give a solution to which 76.5 g (4.25 moles) of water containing 200 ppm by weight of nitric acid were added dropwise under agitation followed by further continued agitation for about 5 hours and standing as such at room temperature for 5 days to give a solution containing 8% by weight, calculated as $SiO_2$, of the hydrolysis-condensation product of tetramethoxy silane. This solution was finally admixed with 1000 ppm by weight of a silicone-based surface active agent (SH 30PA, a product by Toray Silicone Co.).

EXAMPLE 1

A semiconductor silicon wafer having a patterned layer of polycrystalline silicon on the surface was coated on a spinner with the first coating solution prepared in Preparation 1 followed by drying of the coating layer on a hot plate at 250° C. for 3 minutes to give a dried coating layer.

In the next place, the dried coating layer on the substrate was subjected to a first baking treatment at 400° C. for 20 minutes in an atmosphere of nitrogen gas. An infrared absorption spectrum of the thus obtained coating film (FIG. 3, curve I) indicated disappearance of absorption bands in the vicinities of 800–880 cm$^{-1}$, 950 cm$^{-1}$ and 2200 cm$^{-1}$ assignable to Si—H, Si—N and Si—H, respectively.

Further, the coating layer after the first baking treatment was subjected to a second baking treatment at 800° C. for 1 minute to complete a silica coating film having a thickness of 800 nm, which was absolutely free from cracks as inspected by using a scanning electron microscope.

Pieces taken by cutting the above prepared substrate provided with the silica coating film were immersed at room temperature in an aqueous solution containing 0.5% by weight of hydrogen fluoride to examine the etching resistance of the cross sections in the raised and recessed areas to find no erosion in both areas. Further, the etching rate of the silica coating films before and after the second baking treatment was examined against the same hydrofluoric acid solution as used above to find that the etching rate was 40 nm/minute and 15 nm/minute, respectively.

EXAMPLE 2

A silica coating film on the same substrate having a thickness of 800 nm was formed in substantially the same manner as in Example 1 except that the atmosphere for the baking treatment was filled with moisture-containing oxygen gas in place of nitrogen gas.

The thus formed silica coating film was absolutely free from cracks as examined with a scanning electron microscope.

Pieces taken by cutting the above prepared substrate provided with the silica coating film were immersed at room temperature in an aqueous solution containing 0.5% by weight of hydrogen fluoride to examine the etching resistance of the cross sections in the raised and recessed areas to find no erosion in both areas. Further, the etching rate of the silica coating films before and after the second baking treatment was examined against the same hydrofluoric acid solution as used above to find that the etching rate was 20 nm/minute and 10 nm/minute, respectively.

COMPARATIVE EXAMPLE 1

The same substrate material as in Example 1 was coated with the second coating solution prepared in Preparation 2 in place of the first coating solution and subjected to the drying treatment in the same manner as in Example 1. The experimental treatment could no longer be continued due to remarkable sublimation from the coating layer leading to a conclusion of unacceptability of the coating solution.

COMPARATIVE EXAMPLE 2

Figure 3:
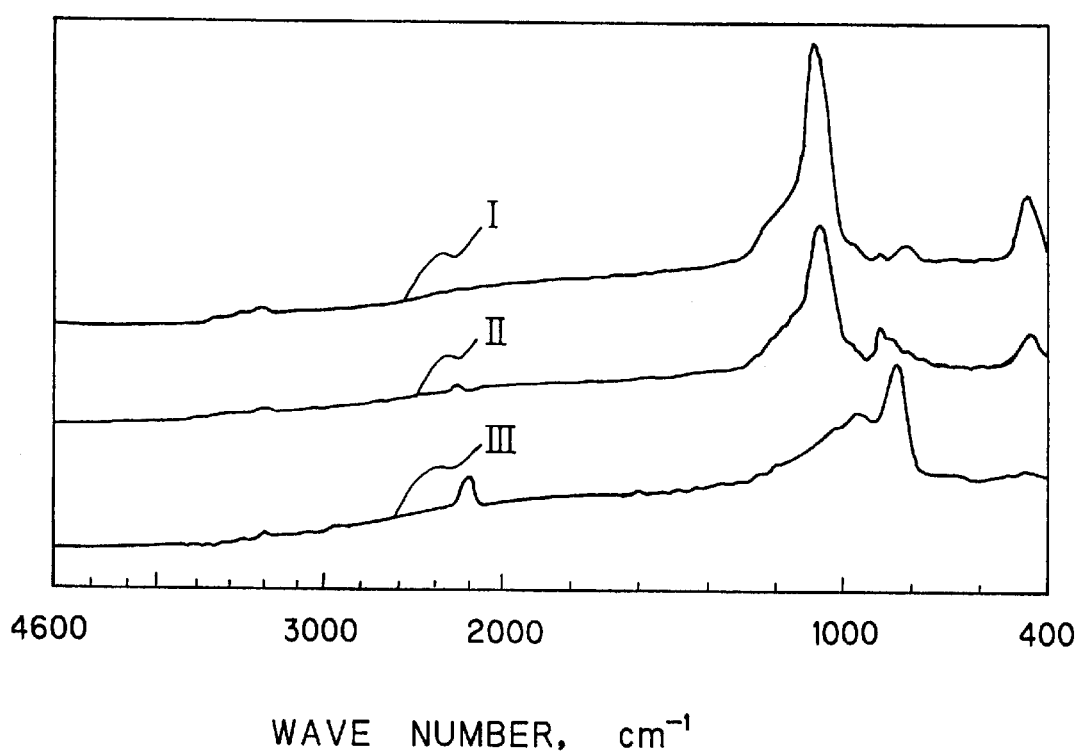
FIG. 3 shows infrared absorption spectra of the coating films in Example 1, Comparative Example 2 and Comparative Example 3 after the first heat treatment by the curves I, III and II, respectively.

The procedure down to the steps of coating, drying and first baking treatment was substantially the same as in Example 1 excepting for the replacement of the first coating solution with the third coating solution prepared in Preparation 3. Curve III of FIG. 3 is an infrared absorption spectrum of the thus formed coating layer indicating presence of the absorption bands in the vicinities of 800–880 cm$^{-1}$, 950 cm$^{-1}$ and 2200 cm$^{-1}$ assignable to Si—H, Si—N and Si—H, respectively.

The coating layer was further subjected to the second baking treatment in the same manner as in Example 1 to complete a silica coating film having a thickness of 800 nm, which was free from any cracks as examined on a scanning electron microscope.

Pieces taken by cutting the above prepared substrate provided with the silica coating film were immersed at room temperature in an aqueous solution containing 0.5% by weight of hydrogen fluoride to examine the etching resistance of the cross sections in the raised and recessed areas to find that no erosion occurred in the raised areas but the recessed areas were hollow by erosion.

COMPARATIVE EXAMPLE 3

The procedure down to the steps of coating, drying and first baking treatments was substantially the same as in Example 2 excepting for the replacement of the first coating solution with the third coating solution prepared in Preparation 3. Curve II of FIG. 3 is an infrared absorption spectrum of the thus formed coating layer indicating presence of the absorption bands in the vicinities of 800–880 cm$^{-1}$ and 950 cm$^{-1}$ assignable to Si—H and Si—N, respectively.

The coating layer was further subjected to the second baking treatment in the same manner as in Example 1 to complete a silica coating film having a thickness of 800 nm, which was free from any cracks as examined on a scanning electron microscope.

Pieces taken by cutting the above prepared substrate provided with the silica coating film were immersed at room temperature in an aqueous solution containing 0.5% by weight of hydrogen fluoride to examine the etching resistance of the cross sections in the raised and recessed areas to find that no erosion occurred in the raised areas but the recessed areas were hollow by erosion.

COMPARATIVE EXAMPLE 4

The procedure down to the steps of coating, drying and first baking treatments was substantially the same as in Example 1 excepting for the replacement of the first coating solution with the fourth coating solution prepared in Preparation 4 and extension of the time of the first baking treatment to 30 minutes. The thickness of the thus obtained film was 600 nm. Since occurrence of cracks was found already in the coating film after the first baking treatment, the second baking treatment was not undertaken.

What is claimed is:

1. A method for the formation of a siliceous coating film on the surface of a substrate which comprises the steps of:
   (a) coating the surface of the substrate with a coating solution of a modified polysilazane compound, which is a reaction product of a polysilazane compound and a dialkyl alkanol amine, in an organic solvent to form a coating layer;
   (b) drying the coating layer to form a dried coating layer;
   (c) subjecting the dried coating layer to a first heat treatment at a temperature in the range from 350 to 450° C. for a length of time in the range from 10 to 60 minutes; and
   (d) subjecting the coating layer to a second heat treatment at a temperature in the range from 550 to 800° C. for a length of time in the range from 0.5 to 60 minutes.

2. The method for the formation of a siliceous coating film as claimed in claim 1 in which the length of time for the second heat treatment in step (d) is in the range from 0.5 to 15 minutes.

3. The method for the formation of a siliceous coating film as claimed in claim 2 in which the length of time for the second heat treatment in step (d) is in the range from 0.5 to 3 minutes.

4. The method for the formation of a siliceous coating film as claimed in claim 1 in which the first heat treatment in step (c) is conducted under monitoring of the infrared absorption spectrum of the coating layer until substantial disappearance of the absorption bands at wave numbers in the vicinities of 800 to 880 cm$^{-1}$, 950 cm$^{-1}$ and 2200 cm$^{-1}$.

5. The method for the formation of a siliceous coating film as claimed in claim 1 in which the polysilazane compound has a weight-average molecular weight in the range from 1500 to 5000 and a molecular weight dispersion not exceeding 4.

6. The method for the formation of a siliceous coating film as claimed in claim 1 in which the dialkyl alkanol amine is selected from the group consisting of N,N-dimethyl ethanolamine, N,N-diethyl ethanolamine, N,N-dibutyl ethanolamine, N,N-dimethyl propanolamine, N,N-dimethyl butanolamine, N,N-dimethyl pentanolamine, N,N-dimethyl hexanolamine and N,N-dimethyl heptanolamine.

7. The method for the formation of a siliceous coating film as claimed in claim 1 in which the dialkyl alkanol amine is selected from the group consisting of dimethyl alkanol amines.

8. The method for the formation of a siliceous coating film as claimed in claim 7 in which the dimethyl alkanol amine is dimethyl hexanolamine.

9. The method for the formation of a siliceous coating film as claimed in claim 1 in which the modified polysilazane compound is a reaction product of a polysilazane compound and a dialkyl alkanol amine in a molar ratio in the range from 99.9:0.1 to 50:50.

10. The method for the formation of a siliceous coating film as claimed in claim 1 in which the organic solvent of the coating solution is selected from the group consisting of alcohols, ketones, glycol ethers, hydrocarbon compounds and ethers.

11. The method for the formation of a siliceous coating film as claimed in claim 1 in which drying of the coating layer in step (b) is conducted at a temperature in the range from 100 to 300° C.

12. The method for the formation of a siliceous coating film as claimed in claim 1 in which the coating solution contains the modified polysilazane compound in a concentration in the range from 10 to 40% by weight.

* * * * *